(12) United States Patent
Okuyama

(10) Patent No.: US 6,177,822 B1
(45) Date of Patent: Jan. 23, 2001

(54) VARIABLE PHASE SHIFTING CIRCUIT MANUFACTURED IN SIMPLE INTEGRATED CIRCUIT

(75) Inventor: Mariko Okuyama, Tokyo (JP)

(73) Assignee: NEC Corporation, Tokyo (JP)

( * ) Notice: Under 35 U.S.C. 154(b), the term of this patent shall be extended for 0 days.

(21) Appl. No.: 09/208,469

(22) Filed: Dec. 10, 1998

(30) Foreign Application Priority Data

Dec. 25, 1997 (JP) ................................................ 9-356569

(51) Int. Cl.$^7$ ................................................ H03H 11/16
(52) U.S. Cl. .................... 327/251; 327/237; 327/272; 327/274; 327/278
(58) Field of Search .................... 327/237, 238, 327/250, 251, 252, 253, 270, 278, 280, 272, 274

(56) References Cited

U.S. PATENT DOCUMENTS

| | | | |
|---|---|---|---|
| 3,568,097 | * 3/1971 | Hyltin | 327/284 |
| 5,063,311 | * 11/1991 | Swapp | 327/278 |
| 5,210,450 | * 5/1993 | Parkison | 327/269 |
| 5,461,342 | * 10/1995 | Crabtree | 330/252 |
| 5,521,540 | * 5/1996 | Marbot | 327/277 |
| 5,945,863 | * 8/1999 | Coy | 327/280 |
| 6,037,842 | * 3/2000 | Bryan et al. | 327/280 |

FOREIGN PATENT DOCUMENTS

| | | |
|---|---|---|
| 63-45913 | 2/1988 | (JP) . |
| 1-268217 | 10/1989 | (JP) . |
| 2-126431 | 10/1990 | (JP) . |
| 3-26015 | 2/1991 | (JP) . |
| 4-196909 | 7/1992 | (JP) . |
| 9-326675 | 12/1997 | (JP) . |

* cited by examiner

Primary Examiner—Terry D. Cunningham
(74) Attorney, Agent, or Firm—McGinn & Gibb, P.C.

(57) ABSTRACT

A variable phase shifting circuit includes a resistance unit and a variable capacitance unit. The resistance unit includes at least one resistor element. The resistance unit input a first signal and a second signal and also output a third signal and a fourth signal. The variable capacitance unit includes two base-to-emitter capacitors of two transistors. The variable capacitance unit is connected to the third signal and the fourth signal. The two base-to-emitter capacitors is varied by controlling collector currents of the two transistors. The third signal and the fourth signal are produced by shifting phases of the first and second signals based on the at least one resistor element and the two base-to-emitter capacitors.

19 Claims, 7 Drawing Sheets

VARIABLE PHASE SHIFTING CIRCUIT MANUFACTURED IN SIMPLE INTEGRATED CIRCUIT

BACKGROUND OF THE INVENTION

1. Field of the Invention

The present invention generally relates to a variable phase shifting circuit and a variable phase shifting method. More specifically, the present invention is directed to such a variable phase shifting method, and also a variable phase shifting circuit easily manufactured in an integrated circuit with a simple circuit arrangement.

2. Description of the Related Art

Conventionally, RC variable phase shifting circuits play an important role specifically in signal processing systems operable in microwave frequency ranges. The RC variable phase shifting circuits are generally composed of resistor elements and capacitor elements, and any one of resistor element and capacitor element is constructed as a variable element.

Japanese Laid Open Patent Application (JP-A-Heisei 1-268217) describes the variable phase shifting circuit capable of realizing the broadband variable width. In this variable phase shifting circuit, the emitter of the first transistor is connected via the first resistor element to the first power supply terminal, and the collector of this transistor is connected via the second resistor element to the second power supply terminal.

The series circuit is connected between the collector of the first transistor and the emitter thereof. This series circuit is composed of the second transistor and the third resistor element. The base of this second transistor is connected to the emitter thereof as the variable capacitor element. Otherwise, the base of the second transistor is connected to the collector thereof.

In this variable phase shifting circuit, the emitter of the third transistor is connected via the fourth resistor element to the first power supply terminal, and the collector of this third transistor is connected via the fifth resistor element to the second power supply terminal.

The series circuit is connected between the collector of the third transistor and the emitter thereof. This series circuit is composed of the fourth transistor and the sixth resistor element. The base of this second transistor is connected to the emitter thereof as the variable capacitor element. Otherwise, the base of the third transistor is connected to the collector thereof.

Furthermore, in this variable phase shifting circuit, both the base of the first transistor and the base of the third transistor are connected to the input terminal. The junction point between the second transistor and the third resistor element is connected to the first output terminal. Also, the junction point between the fourth transistor and the sixth resistor element is connected to the second output terminal.

Either the emitter of the first transistor or the collector thereof is connected to the collector of the second transistor, and either the emitter of the third transistor or the collector thereof is connected to the fourth transistor. It should be noted that in this variable phase shifting circuit, a field-effect transistor (FET) may be employed as each of the above-explained transistors.

On the other hand, Japanese Laid Open Utility Application (JP-U-Heisei 2-126431) discloses a monolithic variable phase shifting circuit. In this reference, an input signal is supplied to a first phase shifting circuit and a second phase shifting circuit such that the input signal is separated into two signals having the phase difference of 90 degrees.

Also, in this monolithic variable phase shifting circuit, the first input signal is supplied to the first phase shifting circuit while the second input signal is supplied to the second phase shifting circuit, such that these input signals are synthesized into a signal not to have a phase difference.

In each of the first phase shifting circuit and the second phase shifting circuit, both of the collector of the transistor and the emitter thereof are grounded in order that the DC voltage can be applied via the resistor element. Also, the series circuit is connected between the collector of the transistor and the emitter thereof. This series circuit is composed of the variable capacitor element, the fixed capacitor element, and the resistor element. This variable capacitor element is formed by the junction capacitance of the transistor.

The base of the transistor is connected to the input terminal. Either the junction point between the variable capacitor element and the resistor element or another junction between the fixed capacitor element and the resistor element is connected to the output terminal.

Furthermore, since the variable capacitance element is connected In parallel to the fixed capacitor element, the degradation of the frequency characteristic can be suppressed. It should also be noted that field-effect transistors may be employed as the respective transistors in this monolithic phase shifting circuit.

Further, Japanese Laid Open Patent Application (JP-A-Heisei 3-26015) discloses the voltage variable phase shifter for controlling the phase of the signal by controlling the voltage by the transistor circuit.

In this voltage-controlled variable phase shifter, the collector of the first transistor is grounded so as to vary the phase of the input signal. The second transistor controls the emitter current supplied from the first transistor in response to the controlling variable voltage. Also, the fixed capacitor element is connected between the emitter of the first transistor and the ground.

In response to the change in the controlling variable voltage, this voltage-controlled variable phase shifter changes the output impedance of the first transistor. Furthermore, both this changed output impedance and the fixed capacitance element determines the phase shift amount.

FIG. 1A and FIG. 1B represent RC variable phase shifting circuits known in this technical field. The RC variable phase shifting circuit shown in FIG. 1A is composed of the resistor element R and the variable capacitor element C'. The predetermined phase shifting amount with respect to the input signal may be obtained by adjusting the capacitor value of the variable capacitor element C'.

Also, the RC variable phase shifting circuit shown in FIG. 1B is composed of the capacitor element C and the variable resistor element R'. The desirable phase shifting amount with respect to the input signal may be obtained by adjusting the resistor value of the variable resistor element R'.

In the case that the above-explained RC variable phase shifting circuits shown in FIG. 1A and FIG. 1B are realized as the integrated circuit, the following problem will arise. That is, it is practically difficult to assemble the variable resistor element R' into the semiconductor element as to the known RC variable phase shifting circuit shown in FIG. 1B.

Also, in the RC variable phase shifting circuit represented in FIG. 1A, for example, the variable capacitor realized by utilizing the reverse biasing of the transistor, which may function as the variable capacitor element C', has been proposed.

However, when the variable capacitor element by using the reverse biasing of the transistor is assembled into the semiconductor element, if the junction capacitor between the base and the emitter is utilized, then the voltage withstanding level is low.

Under such a circumstance, this reverse biasing variable capacitor element can be hardly applied to the semiconductor element. Also, when the junction capacitor established between the base-to-emitter path is used, the change amount of the phase shift is very small. As a consequence, it is practically difficult to obtain a desirable phase shift amount.

SUMMARY OF THE INVENTION

The present invention is accomplished to solve the above-mentioned problems. Therefore, an object of the present invention is to provide a variable phase shifting circuit and a variable phase shifting method, which is easily manufactured in an integrated circuit with a simple circuit arrangement.

In order to achieve an aspect of the proposed invention, a variable phase shifting circuit may include a resistance unit and a variable capacitance unit.

The resistance unit may include at least one resistor element, for inputting a first signal and a second signal and also for outputting a third signal and a fourth signal. The variable capacitor unit may include two base-to-emitter capacitances of two transistors. The variable capacitor unit may be connected to the third signal and the fourth signal.

In this case, the two base-to-emitter capacitances may be varied by controlling collector currents of the two transistors. Also, the third signal and the fourth signal may be produced by shifting phases of the first and second signals based on the at least one resistor element and the two base-to-emitter capacitances.

The resistance unit may include a first resistor element connected to the first signal, for outputting the third signal, and a second resistor element connected to the second signal, for outputting the fourth signal. Also, the second signal is supplied to have a potential of the ground level.

Instead, the resistance unit may include a first resistor element connected to the first signal, for outputting the third signal. The second signal may be outputted as the fourth signal. In this case, the second signal is supplied to have a variable DC potential Vbias2.

The variable capacitance unit may include an amplifying unit having a first transistor and a second transistor, and a constant current source. In the amplifying unit, a collector of the first transistor and a collector of the second transistor are connected to a potential Vcc. Also, a base of the first transistor is connected to the third signal. In addition, a base of the second transistor is connected to the fourth signal.

The constant current source is connected between the emitters of the first and second transistors, and the potential of the ground level. The constant current source controls the collector currents of the first and second transistors. Also, the constant current source may be a variable type constant current source.

The variable phase shifting circuit may further include a differential amplifier unit for eliminating in-phase signal components contained in the third signal and the fourth signal. The second amplifier unit may include a third transistor and a fourth transistor and a fifth transistor.

In the differential amplifier unit, a collector of the third transistor is connected via a third resistor element to the potential of Vcc. A collector of the fourth transistor is connected via a fourth resistor element to the potential of Vcc. A base of the third transistor is connected to the third signal. A base of the fourth transistor is connected to the fourth signal.

Also, a base of the fifth transistor is connected to a DC potential Vbias1. A collector of the third transistor is connected to an emitter of the third transistor and an emitter of the fourth transistor. An emitter of the fifth transistor is connected via a fifth resistor element to the potential of the ground level.

The variable capacitance unit may include the amplifying unit having a first transistor and a second transistor, and a constant current source. In the amplifying unit, a collector of the first transistor and a collector of the second transistor are connected to the potential Vcc. A base of the first transistor is connected to the third signal. A base of the second transistor is connected to the fourth signal.

The constant current source is connected between emitters of the first and second transistors, and the potential of the ground level. The constant current source controls the collector currents of the first and second transistors based on the second signal having a potential of variable DC potential Vbias2. In this case, the constant current source may be a fixed type constant current source.

A phase variable shifting method may include the steps of supplying step and shifting step. In the supplying step, a first signal and a second signal may be supplied. Next, in the shifting step, a phase of the first signal and a phase of the second signal may be shifted based on change of base-to-emitter capacitances of a first transistor and second transistor.

In this case, the shifting step may include steps of a deciding step and a controlling step and a changing step. In the deciding step, collector current values of the first and second transistors may be decided based on a predetermined phase-shift value. Next, in the controlling step, the collector current of the first and second transistors may be controlled based on the decided collector current values. Next, in the changing step, the base-to-emitter capacitances of the first and second transistors may be changed.

In addition, the step of shifting a phase of the first signal is executed in synchronism with the step of shifting a phase of the second signal.

The phase variable shifting method may further include eliminating step. In the eliminating step, in-phase signal components contained in the phase-shifted first signal and the phase-shifted second signal may be eliminated.

A variable phase shifting circuit may include a first resistor element and a second resistor element and an amplifying unit having a first transistor and a second transistor, and a constant current source of variable type.

The first resistor element is connected to a first signal, for outputting a second signal. The second resistor element is connected to a third signal, for outputting a fourth signal.

A collector of the first transistor and a collector of the second transistor are connected to a potential Vcc. A base of the first transistor is connected to the second signal. A base of the second transistor is connected to the fourth signal. The constant current source is connected between an emitter of the first transistor, an emitter of the second transistor, and a potential of the ground level.

Also, a variable phase shifting circuit may include a first resistor element and a second resistor element and an amplifying unit having a first transistor and a second transistor, and a constant current source of variable type, and a differential amplifier unit having a third transistor and a fourth transistor and a fifth transistor.

The first resistor element is connected to a first signal, for outputting a second signal. The second resistor element is connected to a third signal, for outputting a fourth signal.

A collector of the first transistor and a collector of the second transistor are connected to a potential Vcc. A base of the first transistor is connected to the second signal. A base of the second transistor is connected to the fourth signal. The constant current source is connected between an emitter of the first transistor, an emitter of the second transistor, and a potential of the ground level.

A collector of the third transistor is connected via a third resistor element to the potential Vcc. A collector of the fourth transistor is connected via a fourth resistor element to the potential Vcc. A base of the third transistor is connected to the second signal. A base of the fourth transistor is connected to the fourth signal.

A base of the fifth transistor is connected to a DC potential Vbias1. A collector of the fifth transistor is connected to an emitter of the third transistor and an emitter of the fourth transistor. An emitter of the fifth transistor is connected via a fifth resistor element to the potential of the ground level.

In addition, a variable phase shifting circuit may include a first resistor element and a second resistor element, and an amplifying unit having a first transistor and a second transistor, and a constant current source of variable type.

The first resistor element is connected to a first signal, for outputting a second signal. The second resistor element is connected to a third signal supplied to have a potential of the ground level, for outputting a fourth signal.

A collector of the first transistor and a collector of the second transistor are connected to a potential Vcc. A base of the first transistor is connected to the second signal. A base of the second transistor is connected to the fourth signal. The constant current source is connected between an emitter of the first transistor, an emitter of the second transistor, and the potential of the ground level.

Instead, a variable phase shifting circuit may include a first resistor element and an amplifying unit having a first transistor and a second transistor, and a constant current source of fixed type.

The first resistor element is connected to a first signal, for outputting a second signal. A third signal supplied to have a variable DC potential is outputted as a fourth signal.

A collector of the first transistor and a collector of the second transistor are connected to a potential Vcc. A base of the first transistor is connected to the second signal. A base of the second transistor is connected to the fourth signal.

The constant current source is connected between an emitter of the first transistor, an emitter of the second transistor, and a potential of the ground level.

BRIEF DESCRIPTION OF THE DRAWINGS

FIG. 6B indicates a waveform of a second signal; FIG. 6C indicates a waveform of a third signal; and FIG. 6D indicates a waveform of a fourth signal;

DESCRIPTION OF THE PREFERRED EMBODIMENTS

Next, a variable phase shifting circuit of the present invention will be described below in detail with reference to the attached drawings.

Figure 1A:
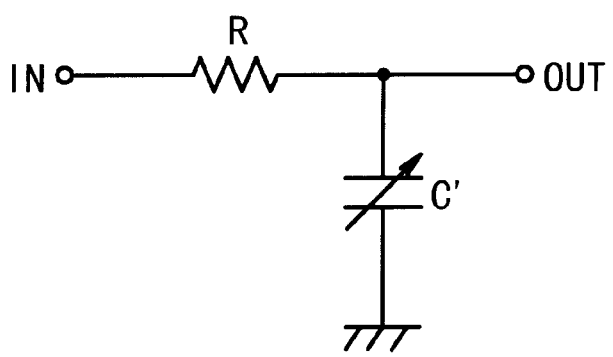
FIG. 1A schematically indicates the conventional RC variable phase shifting circuit.
Figure 1B:
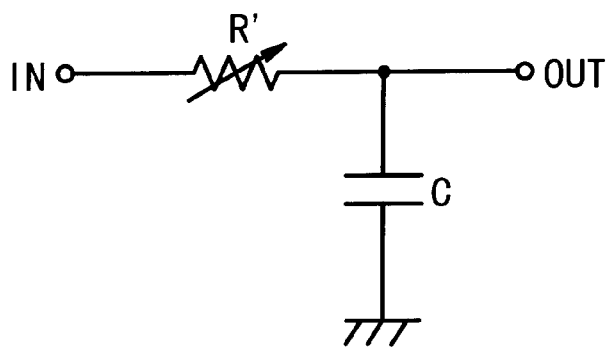
FIG. 1B schematically represents another conventional RC variable phase shifting circuit.
Figure 2:
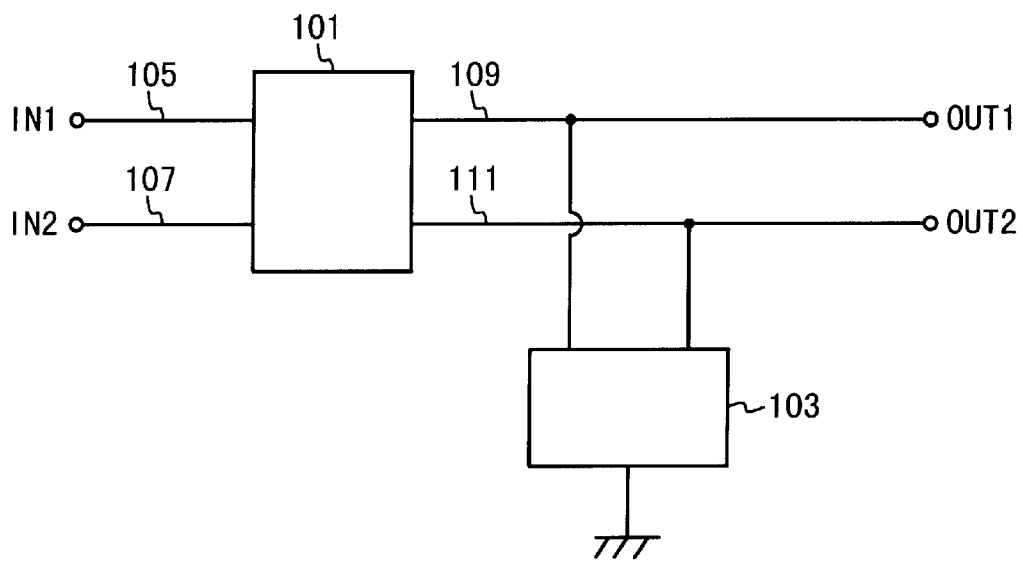
FIG. 2 is a schematic block diagram for showing a technical concept of a variable phase shifting circuit accomplished in accordance with the present invention.

FIG. 2 is a schematic block diagram for explaining a basic idea (conceptual idea) of a variable phase shifting circuit according to the present invention. This basic variable phase shifting circuit includes a resistance unit 101 and a variable capacitance unit 103.

The resistance unit 101 includes at least one resistor element (not shown in detail). A first signal 105 supplied from an input terminal IN1 and a second signal 107 supplied from another input terminal IN2 are inputted into the resistance unit 101. Then, a third signal 109 and a fourth signal 111 are outputted from the resistance unit 101. The third signal 109 and the fourth signal 111 are derived from an output terminal OUT1 and another output terminal OUT2.

The variable capacitance unit 103 includes two base-to-emitter capacitances (not shown either) in two sets of transistors. This variable capacitance unit 103 is connected to the third signal 109 and the fourth signal 111 outputted from the resistance unit 101.

Also, these two base-emitter capacitances included in this variable capacitance unit 103 are operable as a variable capacitor element. This implies that collector currents of these two transistors are controlled.

In addition, both of the third signal 109 and the fourth signal 111 may be produced by shifting phases of the first signal 105 and the second signal 107, based on at least one of resistor elements of the resistance unit 101 and the two base-emitter capacitances of the variable capacitance unit 103.

This implies that the first signal 105 is phase-shifted on change of one, corresponding to the first signal 105, of the base-emitter capacitances of the two transistors. On the other hand, the second signal 107 is phase-shifted on change of the other, corresponding to the second signal 107, of the base-emitter capacitances of the two transistors.

It should be understood that the variable phase shifting circuit indicated in FIG. 2 corresponds to a 2-input/2-output system. Alternatively, this basic variable phase shifting circuit may be applied as a 1-input/1-output system. This 1-input/1-output system may be realized by such that any one of the first signal 105 and the second signal 107, corresponding to the input signal, is supplied to have a predetermined potential (will be discussed later).

Figure 3:
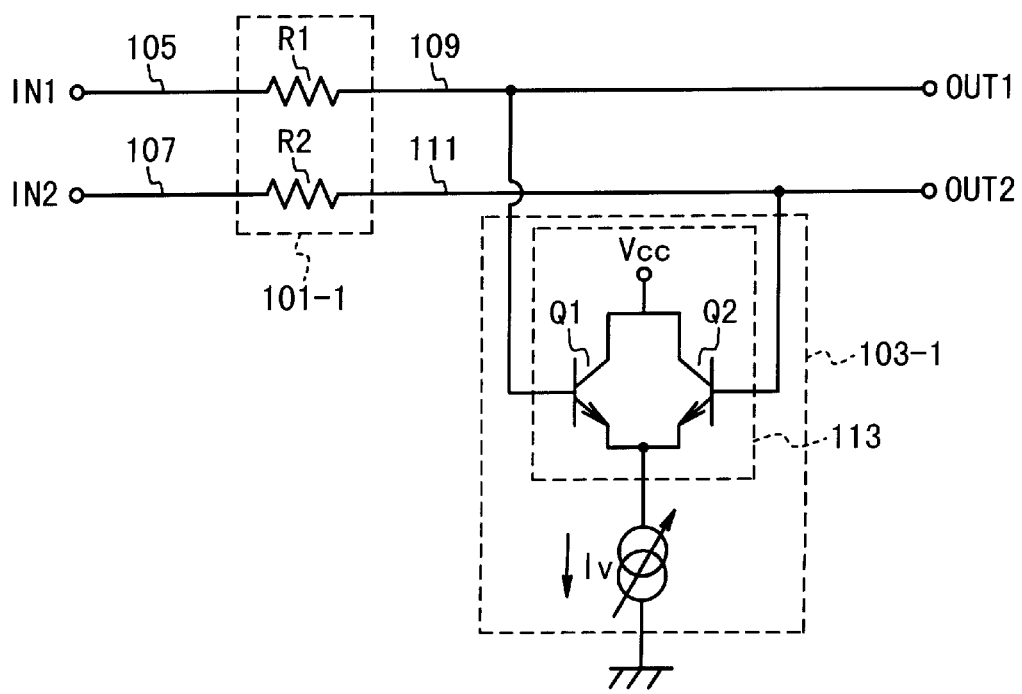
FIG. 3 is a circuit diagram for representing a variable phase shifting circuit according to a first embodiment of the present invention.

FIG. 3 represents a circuit arrangement of a variable phase shifting circuit according to a first preferred embodiment of the present invention. This variable phase shifting circuit of this first embodiment includes a resistance unit 101-1 and a variable capacitance unit 103-1.

The resistance unit 101-1 includes a first resistor element R1 and a second resistor element R2. The first resistor element R1 is connected to the first signal 105 supplied from the input terminal IN1. The first resistor element R1 outputs the third signal 109 outputted from the output terminal OUT1. The second resistor element R2 is connected to the second signal 107 supplied from the another input terminal IN2. The second resistor element R2 outputs the fourth signal 111 outputted from another output terminal OUT2.

The variable capacitance unit 103-1 includes an amplifier unit 113 and a constant current source Iv. Furthermore, the amplifier unit 113 includes a first transistor Q1 and a second transistor Q2. A collector of the first transistor Q1 and a collector of the second transistor Q2 are connected to a first potential Vcc.

Also, a base of the first transistor Q1 is connected to the third signal 109, and a base of the second transistor Q2 is connected to the fourth signal 111. In this first embodiment, the first potential Vcc is set to a voltage range of 1[V] to 5[V].

The constant current source Iv of a variable type is connected between the emitters of the first and second transistors (Q1 and Q2), and a second potential equal to the ground level. In other words, emitter currents of these two transistors (Q1 and Q2) are inputted to this constant current source Iv.

Furthermore, this constant current source Iv adjusts the inputted current to values corresponding to a predetermined phase-shift amount. Therefore, collector currents of the first and second transistors (Q1 and Q2) can be controlled so as to vary a base-to-emitter capacitance of each of the two transistors (Q1 and Q2).

The first signal 105 inputted from the input terminal IN1 and the second signal 107 inputted from the input terminal IN2 are same but complementary in phase. Also, the first transistor Q1 and the second transistor Q2 are such electronics elements having the same characteristics. As a consequence, a current of the first transistor Q1 and a current of the second transistor Q2 are same but complementary in phase.

The base-to-emitter capacitance $C\pi$ of each of the first and second transistors (Q1 and Q2) is expressed as follows:

$$C\pi = Cb + Cje \quad (1),$$

where symbol "Cb" indicates a base capacitance, and symbol "Cje" indicates an emitter-to-base junction capacitance.

Furthermore, this base capacitance Cb is expressed as follows:

$$Cb = \tau_F \, g_m = \tau_F (q \cdot I_c / k\,T) \quad (2),$$

where symbol "$\tau_F$" indicates base propagation time, symbol "$g_m$" indicates mutual inductance, q/k T=26 [mV], and symbol "$I_c$" indicates a collector current. The above defined two formulae may indicate that the base-to-emitter capacitance "$C\pi$" is a function of the collector current "Ic".

Figure 4:
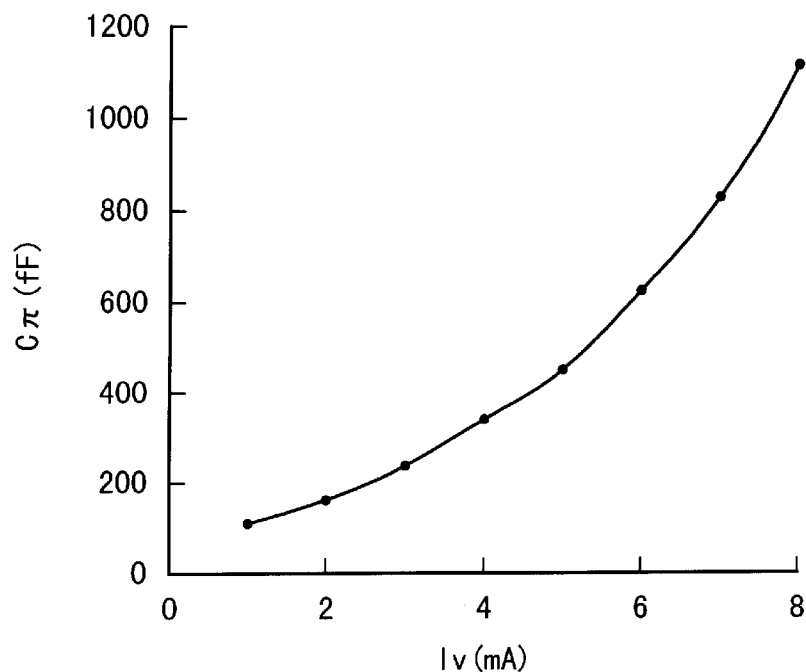
FIG. 4 graphically represents a relationship between a base-to-emitter capacitance and a collector current of a transistor employed in the variable phase shifting circuit of FIG. 3.

FIG. 4 graphically represents a change in the base-to-emitter capacitance $C\pi$ in the case that the current flowing through the constant current source Iv shown in FIG. 3 is varied. That is, FIG. 4 indicates such a fact that since the current flowing through the constant current source Iv is varied within a range between 1 [mA] to 8 [mA], the base-to-emitter capacitance "$C\pi$" is varied within a range between 100 [fF] and 1200 [fF].

In accordance with this first embodiment, the constant current Iv is adjusted so as to control the collector currents Ic of the first and second transistors (Q1 and Q2). Therefore both the phase of the third signal 109 and the phase of the fourth signal 111, which correspond to the output signals of this variable phase shifting circuit, may be shifted by about 0 to 20 degrees.

Figure 5:
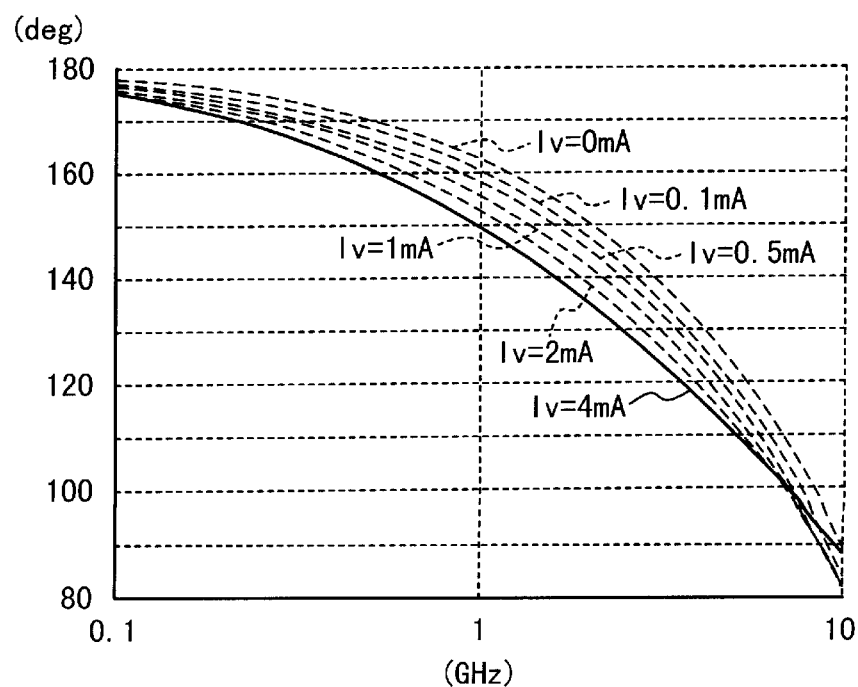
FIG. 5 graphically represents a phase shift amount in a frequency range of the variable phase shifting circuit shown in FIG. 3, while using a current value as a parameter, controlled by a constant current source indicated in FIG. 3.

FIG. 5 graphically represents a phase change in a frequency region, while the current flowing through the constant current source Iv is used as a parameter within a current range between 1 [mA] and 4 [mA].

Figure 6:
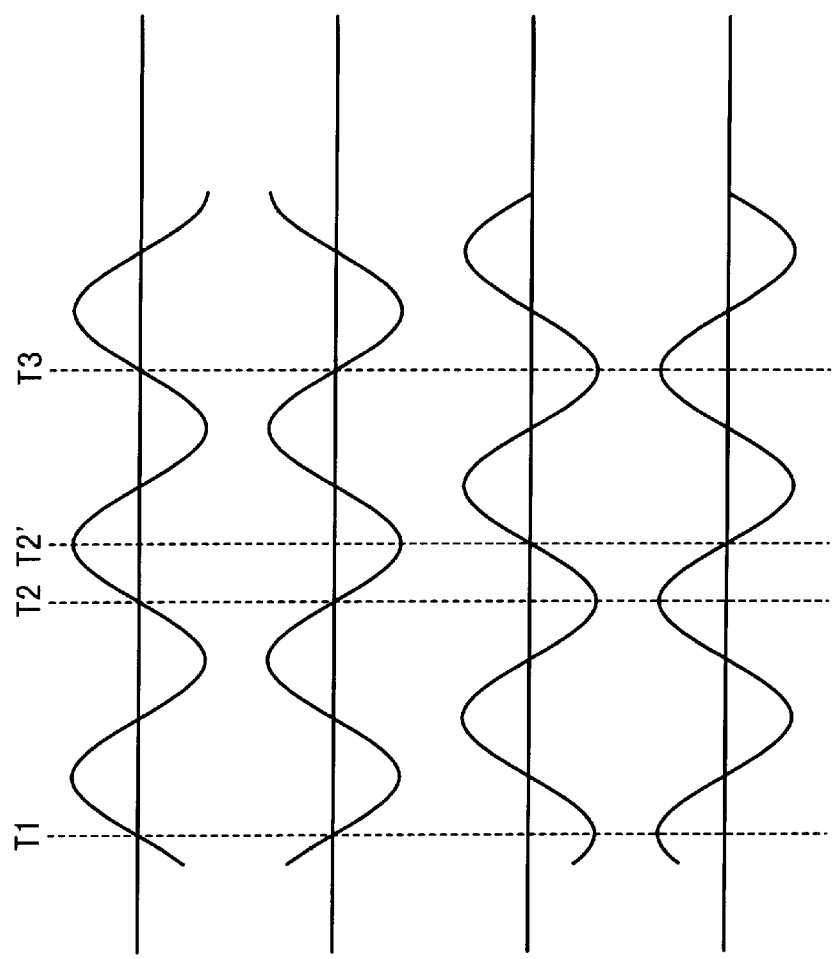
FIGS. 6A to 6D are timing charts for describing operations of the variable phase shifting circuit shown in FIG. 3, namely, FIG. 6A indicates a waveform of a first signal.

Referring now to the circuit arrangement of FIG. 3 and a timing chart shown in FIG. 6, a phase variable shifting operation of the above-explained variable phase shifting circuit according to the first embodiment of the present invention will be described.

First, both the first signal 105 and the second signal 107 are supplied as input signals to this variable phase shifting circuit. These first and second signals are complementary in phase (see FIG. 6A and FIG. 6B). Next, a phase of the first signal 105 and a phase of the second signal 107 are shifted based on change of base-to-emitter capacitances of a first transistor Q1 and second transistor Q2.

In detail, a phase of the first signal 105 and a phase of the second signal 107 are shifted by the following process. First, collector current values of the first and second transistors (Q1 and Q2) are decided based on a predetermined phase-shift value. Next, the collector currents of the first and second transistors (Q1 and Q2) are controlled based on the decided collector current values, respectively. Next, the base-to-emitter capacitances of the first and second transistors are changed.

In the above-described first embodiment, the current value of the variable type constant current source Iv can be adjusted. Therefore, both the collector current of the first transistor Q1 and the collector current of the second transistor Q2 are controlled, so that the base-to-emitter capacitances of these two transistors can be varied.

In accordance with the above-explained operation, the third signal 109 may be produced by phase-shifting the fist signal 105 by the predetermined phase shift amount (see FIG. 6C). Similarly, the fourth signal 111 may be produced by phase-shifting the second signal 107 by the predetermined phase shift amount (see FIG. 6D).

As apparent from the waveform charts shown in FIG. 6C and FIG. 6D, the same phase shift amounts are given to the third signal 109 and the fourth signal 111. Further, the process of shifting the first signal 105 is executed in synchronism with the process of shifting the second signal 107 (time T2→time T2').

This synchronized operation can be performed by controlling the collector currents of the first and second transistors (Q1 and Q2) at the same time. The collector currents of the first and second transistor (Q1, and Q2) are produced from the first signal 105 and the second signal 107 having the phase-complementary relationship with the first signal.

It should be understood that when the first potential Vcc is set to approximately 3[V], the voltage levels of the first signal 105 and the second signal 107 are set within a voltage range between approximately 0.2[V] and 2[V]. This voltage level may be applied to other preferred embodiments.

Figure 7:
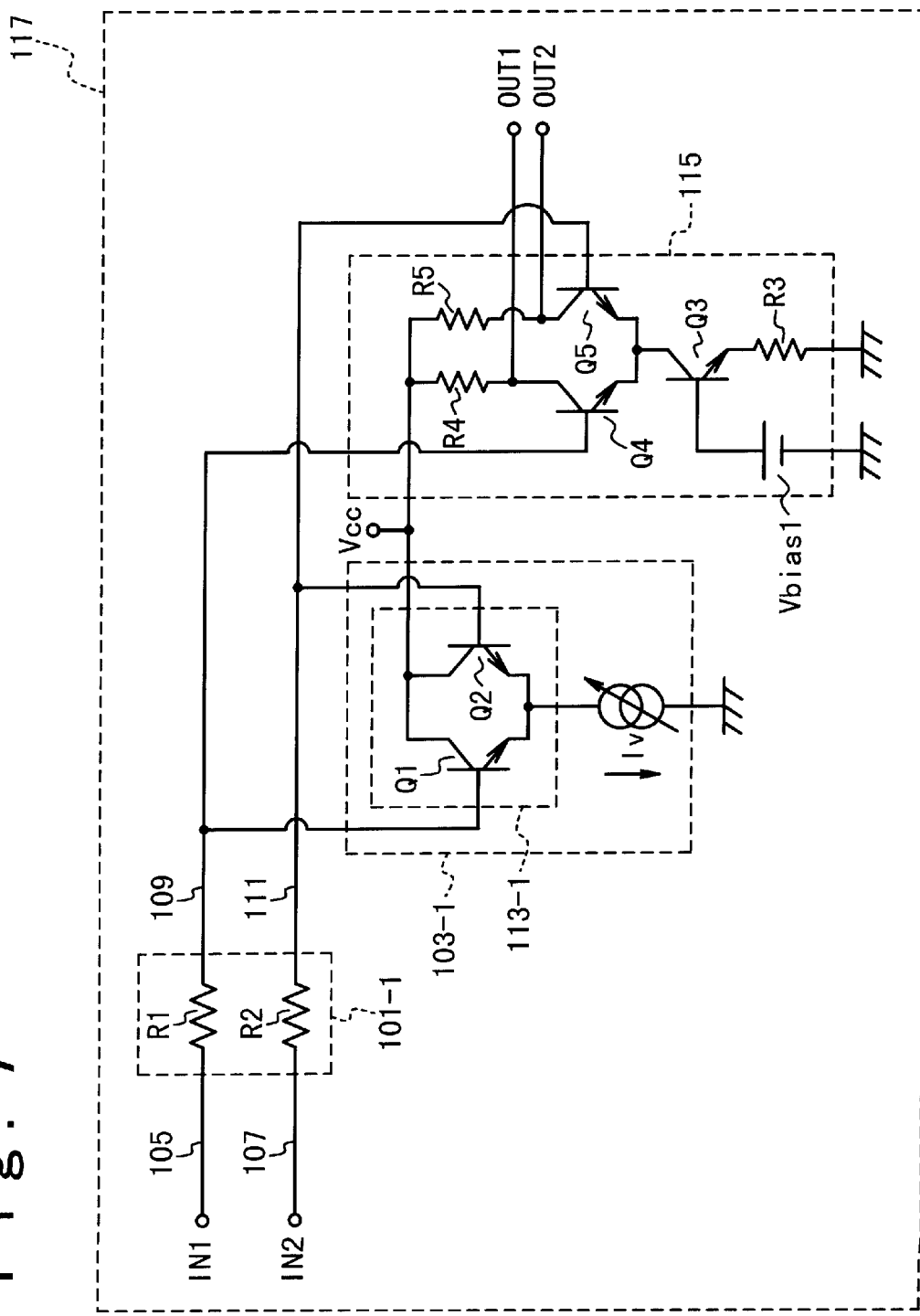
FIG. 7 is a circuit diagram for showing a variable phase shifting circuit according to a second embodiment of the present invention.

FIG. 7 shows a circuit diagram of a variable phase shifting circuit according to a second embodiment of the present invention. This variable phase shifting circuit includes a resistance unit 101-1, a variable capacitance unit 103-1 and a second differential amplifier unit 115. It should be understood that the arrangements and the operations of the resistance unit 101-1 and the variable capacitance unit 103-1 are identical to those of the first embodiment shown in FIG. 3.

The variable phase shifting circuit of the second embodiment involves a different circuit arrangement, namely the employment of the differential amplifier unit 115. The function of this differential amplifier unit 115 is to eliminate an in-phase component contained in a third signal 109 and a fourth signal 111.

The third signal 109 is produced by phase-shifting the first signal 105 on a predetermined phase shift amount, while the fourth signal 111 is produced by phase-shifting the second signal 107 on a predetermined phase shift amount. The variable phase shifting circuit 117 of this second embodiment further including this differential amplifier unit 115 may be extended as a transmission system with high performance.

The differential amplifier unit 115 includes a third transistor Q3, a fourth transistor Q4 and a fifth transistor Q5. A collector of this fourth transistor Q4 is connected via a fourth resistor element R4 to the first potential Vcc, and a collector of the fifth transistor Q5 is similarly connected via a fifth resistor element R5 to the first potential Vcc. A base of the fourth transistor Q4 is connected to the third signal 109, and a base of the fifth transistor Q5 is connected to the fourth signal 111.

Also, a base of the third transistor Q3 is connected to a third potential having a DC potential Vbias1. A collector of the third transistor Q3 is connected to an emitter of the fourth transistor Q4 and an emitter of the fifth transistor Q5. An emitter of the third transistor Q3 is connected via a third resistor element R3 to a second potential equal to the ground level.

In variable phase shifting circuit of this second embodiment, the first potential Vcc is set to a voltage range between 3[V] and 5[V]. The third potential equal to the DC potential Vbias1 is set to another voltage range between 0.3[V] and 1.5[V].

Figure 8:
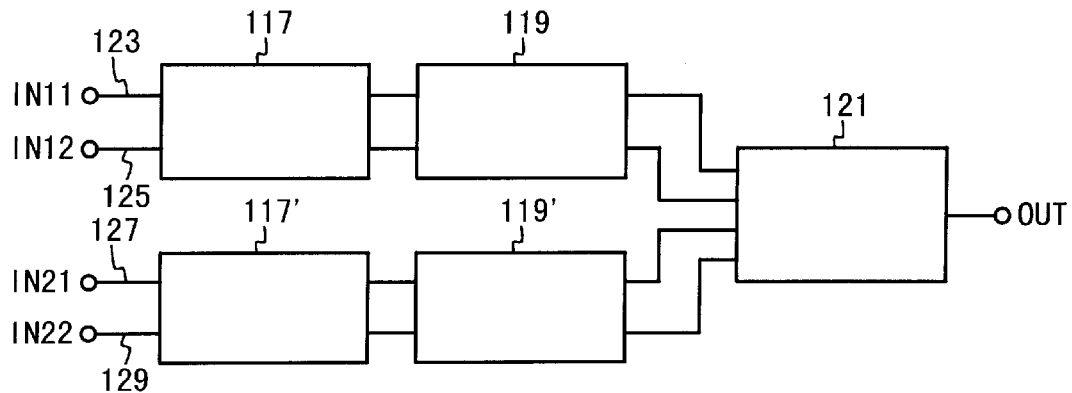
FIG. 8 is a schematic block diagram for indicating a transmission system to which the second variable phase shifting circuit of FIG. 7 is applied.

FIG. 8 schematically shows a transmission system to which the variable phase shifting circuit according to the second embodiment has been applied. This transmission system includes a variable phase shifting circuit (117, and 117'), a quadrature phase shifting modulator (119, and 119'), and a synthesizing amplifier 121.

Two sets of the above-described variable phase shifting circuits (117, and 117') are prepared as the systems having the essentially same characteristics, and two sets of the above-described quadrature phase shifting modulators (119, and 119') are prepared as the systems having the essentially same performance.

One variable phase shifting circuit 117 phase-shifts the first input signal 123 inputted from the input terminal IN11, and also the second input signal 125 inputted from the input terminal IN12 on predetermined phase shift amounts. Also, on the other hand, the other variable phase shifting circuit 117' phase-shifts the third input signal 127 inputted from the input terminal IN21, and also the fourth input signal 129 entered from the input terminal IN22 on the predetermined phase shift amounts.

As to the phase shift aspect, both the first input signal 123 and the second input signal 125 are the same signals but complementary in phase. Also, both the third input signal 127 and the fourth input signal 129 are the same signals but complementary in phase. The first input signal 123 and the third input signal 127 are the same signals having a phase difference of 90 degrees from each other.

Both a phase-shifted first input signal and the phase-shifted second input signal are supplied to one quadrature phase shifting modulator 119 so as to be quadrature-phase-modulated. Also, both the phase-shifted third input signal and the phase-shifted fourth input signal are supplied to the other quadrature phase shifting modulator 119' in order to be quadrature-phase-modulated.

As a result, two sets of the quadrature phase shifting modulators 119 and 119' output signals having phase difference of 0, 90, 180, and 270 degrees. These phase difference signals are synthesized with each other by the synthesizing amplifier 121 to thereby output a synthesized signal.

In the case that a phase difference between the first input signal 123 and the third input signal 127 is equal to 90 degrees+α and 90 degrees−α, this phase difference of +α and −α can be adjusted by controlling the current of the constant current source employed in any one of these variable phase shifting circuits (117, and 117').

Figure 9:
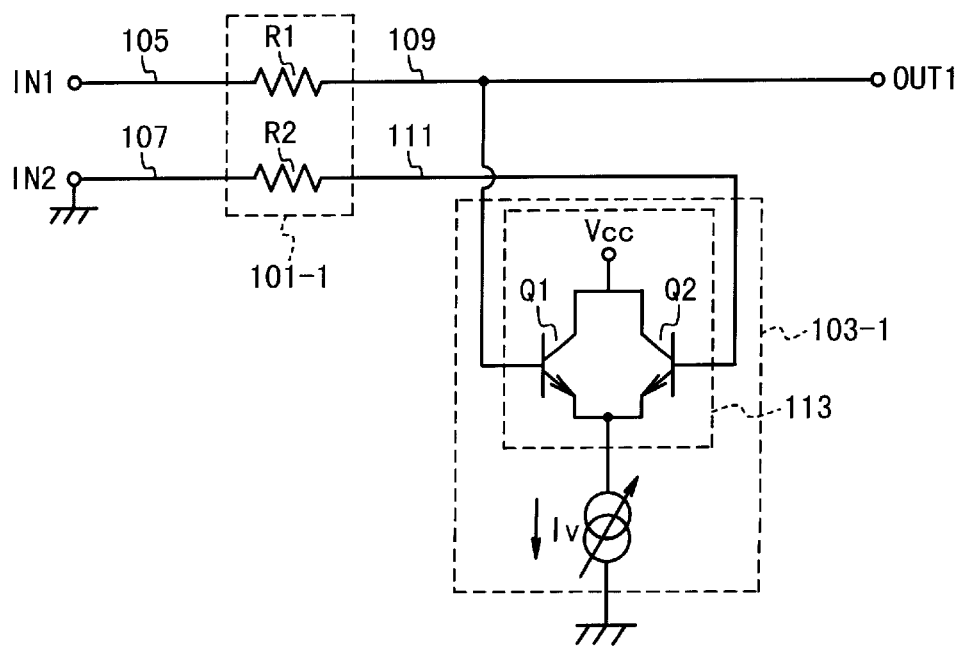
FIG. 9 is a circuit arrangement for representing a variable phase shifting circuit according to a third embodiment of the present invention.

FIG. 9 shows a circuit diagram of a variable phase shifting circuit according to a third embodiment of the present invention. This variable phase shifting circuit includes a resistance unit 101-1 and a variable capacitance unit 103-1. It should be understood that the arrangements and the operations of the resistance unit 101-1 and the variable capacitance unit 103-1 are identical to those of the first embodiment shown in FIG. 3.

The variable phase shifting circuit of the third embodiment involves a different circuit arrangement, namely a second signal 107 is supplied to have a potential equal to the ground level, as compared with the first embodiment. Furthermore, since a fourth signal 111 produced by phase-shifting the second signal 107 is not outputted from the output terminal, this variable phase shifting circuit corresponds to a 1-input/1-output system.

A phase variably shifting operation of the above-explained variable phase shifting circuit according to the third embodiment of the present invention will be described.

First, both a first signal 105 and the second signal 107 are supplied as input signals to this variable phase shifting circuit. The second signal 105 is substantially zero. Next, a phase of the first signal 105 is shifted based on change of a base-to-emitter capacitance of a first transistor Q1.

In detail, a phase of the first signal 105 is shifted by the following process. First, a collector current value of the first transistor Q1 is decided based on a predetermined phase-shift value. Next, the collector current of the first transistor Q1 is controlled based on the decided collector current value. Next, the base-to-emitter capacitance of the first transistor Q1 is changed.

Similar to the first embodiment, in accordance with this third embodiment, since the emitter current of the first transistor Q1 is controlled by the variable type constant current source Iv, the collector current of the first transistor Q1 is controlled. The first potential Vcc is set to a voltage range between 1[V] and 5[V].

Figure 10:
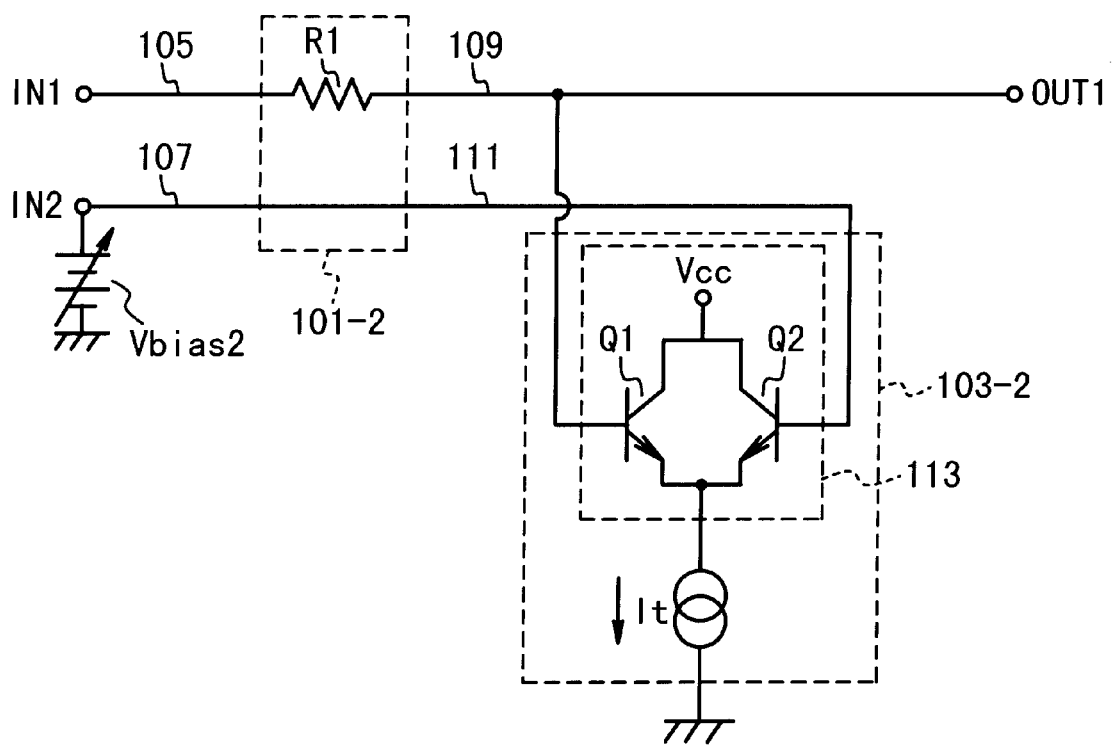
FIG. 10 is a circuit arrangement for indicating a variable phase shifting circuit according to a fourth embodiment of the present invention.

FIG. 10 is a circuit arrangement of a variable phase shifting circuit according to a fourth embodiment of the present invention. The fourth variable phase shifting circuit includes a resistance unit 101-2 and a variable capacitance unit 103-2.

This variable phase shifting circuit of the fourth embodiment involves a different circuit arrangement from that of the first embodiment. That is, the second signal 107 is supplied to have a potential equal to the variable DC potential Vbias2. Moreover, the variable phase shifting circuit according to the fourth embodiment corresponds to a 1-input/1-output system.

The resistance unit 101-2 includes a first resistor element R1. The first resistor element R1 is connected to the first signal 105, for outputting a third signal 109. Also, a second signal 107 is outputted as the fourth signal 111. The second signal 107 is supplied to have a fourth potential equal to a variable DC potential Vbias2.

The variable capacitance unit 103-2 includes an amplifying unit 113 and a constant current source It. Furthermore, the amplifying unit 113 includes a first transistor Q1 and a second transistor Q2.

Both a collector of the first transistor Q1 and a collector of the second transistor Q2 are connected to the first potential Vcc. A base of this first transistor Q1 is connected to the third signal 109. A base of the second transistor Q2 is connected to the fourth signal 111.

The constant current source It is a fixed type constant current source connected between the emitters of the first and second transistors (Q1 and Q2), and a second potential equal to the ground level. This constant current source "It" controls the collector currents of the first and second transistors (Q1 and Q2) based on the controlled potential of the DC potential Vbias2.

The phase variably shifting operation of the above-explained variable phase shifting circuit according to the fourth embodiment of the present invention will be described.

First, both the first signal 105 and the second signal 107 are supplied as input signals to this variable phase shifting circuit. The second signal 105 is supplied on the DC potential Vbias2. Next, a phase of the first signal 105 is shifted based on change of base-to-emitter capacitances of the first transistor Q1 and second transistor Q2.

In detail, a phase of the first signal 105 is shifted as following process. First, a collector current value of the first transistor Q1 is decided based on a predetermined phase-shift value. Next, the collector current of the first transistor Q1 is controlled based on the decided collector current value and the DC potential Vbias2. Next, the base-to-emitter capacitance of the first transistor Q1 is changed.

In accordance with this fourth embodiment, since the emitter current of the first transistor Q1 is controlled by the fixed type constant current source It, the collector current of the first transistor Q1 is controlled. The first potential Vcc is set to a voltage range between 1[V] and 5[V]. Also, the variable DC potential Vbias2 is set to a voltage range between 1.5[V] and 2.5[V].

What is claimed is:

1. A variable phase shifting circuit comprising:
   a resistance unit including at least one resistor element, for inputting a first signal and a second signal and also for outputting a third signal and a fourth signal; and
   a variable capacitance unit comprising a first transistor, a second transistor operatively coupled to said first transistor and a constant current source for sinking a current from emitters of said first and second transistors,
   wherein the base of said first transistor is coupled to said third signal and the base of said second transistor is coupled to said fourth signal, and
   wherein said third signal and said fourth signal providing the output for the variable phase shifting circuit and are produced by shifting phases of said first signal and said second signal and degrees of shift of said phases are varied by varying said current to said first transistor and said second transistor.

2. A variable phase shifting circuit according to claim 1, wherein said at least one resistor element comprises:
   a first resistor element connected to said first signal, for outputting said third signal; and
   a second resistor element connected to said second signal, for outputting said fourth signal.

3. A variable phase shifting circuit according to claim 2, wherein said second signal is supplied to have a predetermined potential.

4. A variable phase shifting circuit according to claim 1, wherein said at least one resistor element comprises:
   a first resistor element connected to said first signal, for outputting said third signal, and wherein said second signal is outputted as said fourth signal.

5. A variable phase shifting circuit according to claim 4, wherein said second signal is supplied to have a predetermined potential.

6. A variable phase shifting circuit according to claim 1,
   wherein the collector of said first transistor and the collector of said second transistor are connected to a first predetermined potential, the base of said first transistor is connected to said third signal, and the base of said second transistor is connected to said fourth signal; and
   wherein said constant current source is connected between the emitters of said first and second transistors, and a second predetermined potential, and
   wherein said constant current source selectively varies the current of said first and second transistors.

7. A variable phase shifting circuit according to claim 6, wherein said constant current source is a variable type constant current source.

8. A variable phase shifting circuit comprising:
   a resistance unit including at least one resistor element, for inputting a first signal and a second signal and also for outputting a third signal and a fourth signal;
   a variable capacitance unit comprising a first transistor, a second transistor operatively coupled to said first transistor and a constant current source for inputting a current to emitter arms of said first and second transistors,
   wherein the collector of said first transistor and the collector of said second transistor are connected to a first predetermined potential, the base of said first transistor is connected to said third signal and the base of said second transistor is connected to said fourth signal; and
   wherein said constant current source is connected between the emitters of said first and second transistors, and a second predetermined potential,
   wherein said constant current source selectively varies the current of said first and second transistors, and
   wherein said third signal and said fourth signal are produced by shifting phases of said first signal and said second signal and degrees of shift of said phases are varied by varying said current to said first transistor and said second transistor, and
   a differential amplifying unit coupled to said third signal and said fourth signal for eliminating in-phase signal components contained in said third signal and said fourth signal.

9. A variable phase shifting circuit according to claim 8, wherein said differential amplifying unit comprises:

a third transistor and a fourth transistor, wherein a collector of said third transistor is connected via a third resistor element to said first predetermined potential, the collector of said fourth transistor is connected via a fourth resistor element to said first predetermined potential, the base of said third transistor is connected to said third signal, the base of the fourth transistor is connected to said fourth signal; and a fifth transistor, wherein the base of said fifth transistor is connected to a third predetermined potential, the collector of said fifth transistor is connected to the emitter of said third transistor and the emitter of said fourth transistor, and the emitter of said fifth transistor is connected via a fifth resistor element to a fourth predetermined potential.

10. A variable phase shifting circuit according to claim 1, wherein the collector of said first transistor and the collector of said second transistor are connected to a first predetermined potential, and wherein said constant current source is connected between the emitters of said first and second transistors, and a second predetermined potential, and wherein said constant current source controls the collector currents of said first and second transistors, and wherein said second signal has a third predetermined potential.

11. A variable phase shifting circuit according to claim 10, wherein said constant current source is a fixed type constant current source.

12. A variable phase shifting method, comprising:

supplying a first signal and a second signal to a variable capacitance unit comprising a first transistor, a second transistor operatively coupled to said first transistor and a constant current source for sinking a current from the emitter of said first and second transistors;

wherein said first signal is phase shifted to produce said third signal and said second signal is phase shifted to produce said fourth signal, and wherein the base of said first transistor is coupled to said third signal and the base of said second transistor is coupled to said fourth signal, and shifting the phase of said first signal and the phase of said second signal by varying the base-to-emitter capacitances of said first transistor and said second transistor and providing said third and fourth signals as the phase shifted output.

13. A variable phase shifting method according to claim 12, wherein said shifting comprises:

varying said constant current source to control the amount of collector current of said first and second transistors, wherein said amount of said collector current controls the amount of base-to-emitter capacitances of said first and second transistors, and wherein said amount of said base-to-emitter capacitances controls degrees of phase shift of said first signal and said second signal to produce said third signal and said fourth signal.

14. A variable phase shifting method according to claim 12, wherein said shifting a phase of said first signal is executed in synchronism with said shifting a phase of said second signal.

15. A variable phase shifting method according to claim 12, further comprising:

eliminating in-phase signal components contained in said phase-shifted first signal and said phase-shifted second signal.

16. A variable phase shifting circuit comprising:

a first resistor element connected to a first signal, for outputting a second signal;

a second resistor element connected to a third signal, for outputting a fourth signal;

a first transistor and a second transistor, wherein the collector of said first transistor and the collector of said second transistor are connected to a first predetermined potential, the base of said first transistor is connected to said second signal, and the base of said second transistor is connected to said fourth signal; and a constant current source connected between the emitter of said first transistor and the emitter of said second transistor, and a second predetermined potential and wherein the second and fourth signals are provided as the output for the variable phase shifting circuit.

17. A variable phase shifting circuit comprising:

a first resistor element connected to a first signal, for outputting a second signal;

a second resistor element connected to a third signal, for outputting a fourth signal;

a first transistor and a second transistor, wherein the collector of said first transistor and the collector of said second transistor are connected to a first predetermined potential, the base of said first transistor is connected to said second signal, and the base of said second transistor is connected to said fourth signal;

a constant current source connected between the emitter of said first transistor and the emitter of said second transistor, and a second predetermined potential;

a third transistor and a fourth transistor, wherein the collector of said third transistor is connected via a third resistor element to said first predetermined potential, the collector of said fourth transistor is connected via a fourth resistor element to said first predetermined potential, the base of said third transistor is connected to said second signal, the base of said fourth transistor is connected to said fourth signal; and a fifth transistor, wherein the base of said fifth transistor is connected to a third predetermined potential, the collector of said fifth transistor is connected to the emitter of said third transistor and the emitter of said fourth transistor, and the emitter of said fifth transistor is connected via a fifth resistor element to a fourth predetermined potential.

18. A variable phase shifting circuit comprising:

a first resistor element connected to a first signal, for outputting a second signal;

a second resistor element connected to a third signal supplied to have a first predetermined potential, for outputting a fourth signal;

a first transistor and a second transistor, wherein the collector of said first transistor and the collector of said second transistor are connected to a second predetermined potential, the base of said first transistor is connected to said second signal, and the base of said second transistor is connected to said fourth signal; and a constant current source connected between the emitter of said first transistor and the emitter of said second transistor, and said first predetermined potential.

19. A variable phase shifting circuit comprising:
a first resistor element connected to a first signal, for outputting a second signal,
a first transistor and a second transistor, wherein the collector of said first transistor and the collector of said second transistor are connected to a first predetermined potential, the base of said first transistor is connected to said second signal, and the base of said second transistor is connected to a third signal having a second predetermined potential; and
a constant current source connected between the emitter of said first transistor and the emitter of said second transistor, and a third predetermined potential and wherein the second and third signals are provided as the output for the variable phase shifting circuit.

* * * * *